US012063775B2

United States Patent
Marzaki et al.

(10) Patent No.: US 12,063,775 B2
(45) Date of Patent: Aug. 13, 2024

(54) READ ONLY MEMORY

(71) Applicants: STMicroelectronics (Rousset) SAS, Rousset (FR); STMicroelectronics (Crolles 2) SAS, Crolles (FR)

(72) Inventors: Abderrezak Marzaki, Cabries (FR); Mathieu Lisart, Aix en Provence (FR); Benoit Froment, Grenoble (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 18/484,906

(22) Filed: Oct. 11, 2023

(65) Prior Publication Data

US 2024/0040781 A1    Feb. 1, 2024

Related U.S. Application Data

(63) Continuation of application No. 17/540,029, filed on Dec. 1, 2021, now Pat. No. 11,818,883.

(30) Foreign Application Priority Data

Dec. 18, 2020   (FR) .................................... 2013741

(51) Int. Cl.
*H10B 20/00*   (2023.01)
*H01L 23/00*   (2006.01)
*G11C 16/04*   (2006.01)

(52) U.S. Cl.
CPC ....... *H10B 20/367* (2023.02); *G11C 16/0466* (2013.01); *H01L 23/57* (2013.01)

(58) Field of Classification Search
CPC ..... H10B 20/367; H01L 23/57; H01L 27/112; H01L 27/11213; G11C 16/0466
See application file for complete search history.

(56) References Cited

U.S. PATENT DOCUMENTS

| 11,404,549 B2* | 8/2022 | Cai ................. H01L 29/66825 |
| 2019/0147960 A1* | 5/2019 | Menezes .............. H01L 29/36 |
| | | 365/185.12 |

(Continued)

OTHER PUBLICATIONS

La Rosa, F. et al., "40nm embedded Select in Trench Memory (eSTM) Technology Overview," 2019 IEEE 11th International Memory Workshop (IMW), IEEE, May 12, 2019, 9 pages.

(Continued)

*Primary Examiner* — David Vu
*Assistant Examiner* — Brandon C Fox
(74) *Attorney, Agent, or Firm* — Slater Matsil, LLP

(57) ABSTRACT

The present description concerns a ROM including at least one first rewritable memory cell. In an embodiment, a method of manufacturing a read-only memory (ROM) comprising a plurality of memory cells is proposed. Each of the plurality of memory cells includes a rewritable first transistor and a rewritable second transistor. An insulated gate of the rewritable first transistor is connected to an insulated gate of the rewritable second transistor. The method includes successively depositing, on a semiconductor structure, a first insulating layer and a first gate layer, wherein the first insulating layer is arranged between the semiconductor structure and the first gate layer, wherein the rewritable second transistor further includes a well-formed between an associated first insulating layer and the semiconductor structure, and wherein the rewritable first insulating layer is in direct contact with the semiconductor structure; and successively depositing a second insulating layer and a second gate layer.

20 Claims, 10 Drawing Sheets

(56) References Cited

U.S. PATENT DOCUMENTS

| | | |
|---|---|---|
| 2019/0348543 A1 | 11/2019 | Bhattacharyya |
| 2020/0350213 A1 | 11/2020 | Ramkumar et al. |
| 2022/0328509 A1 | 10/2022 | Melul et al. |
| 2023/0081072 A1 | 3/2023 | Ramkumar et al. |

OTHER PUBLICATIONS

Niel, S. et al., "Embedded Select in Trench Memory ( eSTM), best in class 40nm floating gate based cell: a process integration challenge," 2018 IEEE International Electron Devices Meeting (IEDM), IEEE, Dec. 1, 2018, 4 pages.

* cited by examiner

READ ONLY MEMORY

CROSS-REFERENCE TO RELATED APPLICATIONS

This application is a continuation of U.S. application Ser. No. 17/540,029, filed on Dec. 1, 2021, which claims priority to French Application No. FR 2013741, filed on Dec. 18, 2020, which applications are hereby incorporated by reference herein in their entirety.

TECHNICAL FIELD

The present disclosure generally concerns electronic systems and devices, and more particularly memory circuits, or memories. The present disclosure more specifically relates to a read only memory (ROM).

BACKGROUND

Currently, the miniaturization of electronic devices and the improvement of their performance require improving data storage devices. Indeed, memories have to be smaller and smaller and to store more and more data. There exists a multitude of different memory types. Indeed, in certain memories, the stored data can be consulted or modified at any time, while others only store data when they are powered on. A flash memory is a volatile storage memory, that is, a memory where data can be written or be modified at any time. A ROM is a non-rewritable memory into which data are written, generally during the memory manufacturing, and can no longer be modified. The data stored in a ROM are only consultable. It would be desirable to at least partly improve certain aspects of known ROMs.

SUMMARY

Technical advantages are generally achieved by embodiments of this disclosure, which describe read only memory (ROM).

There is a need for smaller ROMs.

There is a need for ROMs more resistant to hacking techniques, such as reverse engineering techniques.

An embodiment overcomes all or part of the disadvantages of known ROMs.

An embodiment provides a ROM comprising at least one first rewritable memory cell.

According to an embodiment, said first memory cell is of e-STM type.

According to an embodiment, the ROM further comprises at least one second memory cell comprising a transistor.

According to an embodiment, the transistor is a MOS transistor.

According to an embodiment, the transistor is an N-channel MOS transistor.

According to an embodiment, when the threshold voltage of the first memory cell or of the second memory cell is higher than a threshold, then said first or second memory cell represents a first bit value, and when said threshold voltage is lower than said threshold, then said first or second memory cell represents a second bit value different from the first value.

According to an embodiment, the first and second memory cells comprise a structure successively comprising: a doped substrate of a first conductivity type; a first semiconductor layer of a second conductivity type resting on said substrate; and a second semiconductor layer of a first conductivity type resting on said first semiconductor layer.

According to an embodiment, the first memory cell comprises a first insulated gate and a second insulated gate stacked on each other.

According to an embodiment, the first and second insulated gates of said first memory cell are arranged on a first portion of the surface of said structure.

According to an embodiment, the second memory cell comprises a third insulated gate having a thickness equal to the sum of the thicknesses of the first and second insulated gates of the first memory cell.

Another embodiment provides a method of manufacturing a ROM comprising at least one third rewritable memory cell and at least one fourth memory cell comprising a transistor, the method comprising the successive steps of: successively depositing, on a semiconductor structure, a first insulating layer and a first gate layer; forming a cavity at the location of the gate of the transistor of the fourth memory cell in the first gate layer; and successively depositing a second insulating layer and a second gate layer.

According to an embodiment, the structure successively comprises: a second doped substrate of a first conductivity type; a third semiconductor layer of a second conductivity type resting on said substrate; and a third semiconductor layer of a first conductivity type resting on said first semiconductor layer.

According to an embodiment, the method further comprises a step of etching of the first and second insulating layers and of the second gate layer enabling to form the insulated gate of said at least one second memory cell.

According to an embodiment, the third rewritable memory cell is of e-STM type.

According to an embodiment, the method further comprises a step of etching of the first and second insulating layers and of the first and second gate layers enabling to form a stack of two insulated gates of the third memory cell of e-STM type.

According to an embodiment, the semiconductor structure comprises at least one trench made of a semiconductor material, and the location of the gate of the transistor of the fourth memory cell is laterally delimited on one side by said at least one trench.

Another embodiment provides a ROM comprising at least first and second memory cells of e-STM type, each comprising a first insulated gate and a second insulated gate stacked on each other, wherein the first insulated gate is electrically coupled to the second insulated gate.

According to an embodiment, when the threshold voltage of the first memory cell or of the second memory cell is higher than a threshold, then said first or second memory cell represents a first bit value, and when said threshold voltage is lower than said threshold, then said first or second memory cell represents a second bit value different from the first value.

According to an embodiment, said first memory cell further comprises an N-type doped well.

According to an embodiment, said well has a dopant element implant concentration in the range from $1\times10^{13}$ to $5\times10^{13}$ at·cm$^{-3}$.

According to an embodiment, said well is arranged under the first gate of the first memory cell.

According to an embodiment, the first insulated gate of the first memory cell comprises a first insulating layer, and the first insulated gate of the second memory cell comprises a second insulating layer.

According to an embodiment, the material of the first insulating layer is different from the material of the second insulating layer.

According to an embodiment, the material of the first insulating layer and the material of the second insulating layer are silicon oxide.

According to an embodiment, the thickness of the first insulating layer is different from the thickness of the second insulating layer.

According to an embodiment, the thickness of the first insulating layer and the thickness of the second insulating layer are in the range from 5 to 20 nm.

According to an embodiment, the thickness of the first insulating layer is in the order of 15 nm and the thickness of the second insulating layer is in the order of 8.7 nm.

According to an embodiment, the first and second memory cells are formed from a structure successively: a doped substrate of a first conductivity type; a first semiconductor layer of a second conductivity type resting on said substrate; and a second semiconductor layer of a first conductivity type resting on said first semiconductor layer.

According to an embodiment, the first and second insulated gates are formed on a first portion of the surface of said structure.

Another embodiment provides a method of manufacturing a ROM comprising at least first and second memory cells of e-STM type, each comprising a first insulated gate and a second insulated gate stacked on each other, wherein a via crossing the first insulated gate is formed to couple the first insulated gate to the second insulated gate.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Like features have been designated by like references in the various figures. In particular, the structural or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the readout, powering, writing, etc. circuits, generally associated with memories are not described herein, the described ROMs being compatible with most usual readout, powering, writing, etc. circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

As usual, the following terms are used: lightly-doped semiconductor layer designates a layer having a dopant atom concentration in the range from $10^{14}$ to $5 \times 10^{15}$ at·cm$^{\wedge}(-3)$; heavily-doped semiconductor layer designates a layer having a dopant atom concentration in the range from $10^{17}$ to $10^{18}$ at·cm$^{\wedge}(-3)$; and very heavily-doped semiconductor layer designates a layer having a dopant atom concentration in the range from $10^{18}$ to $10^{20}$ at·cm$^{\wedge}(-3)$.

Figure 1:
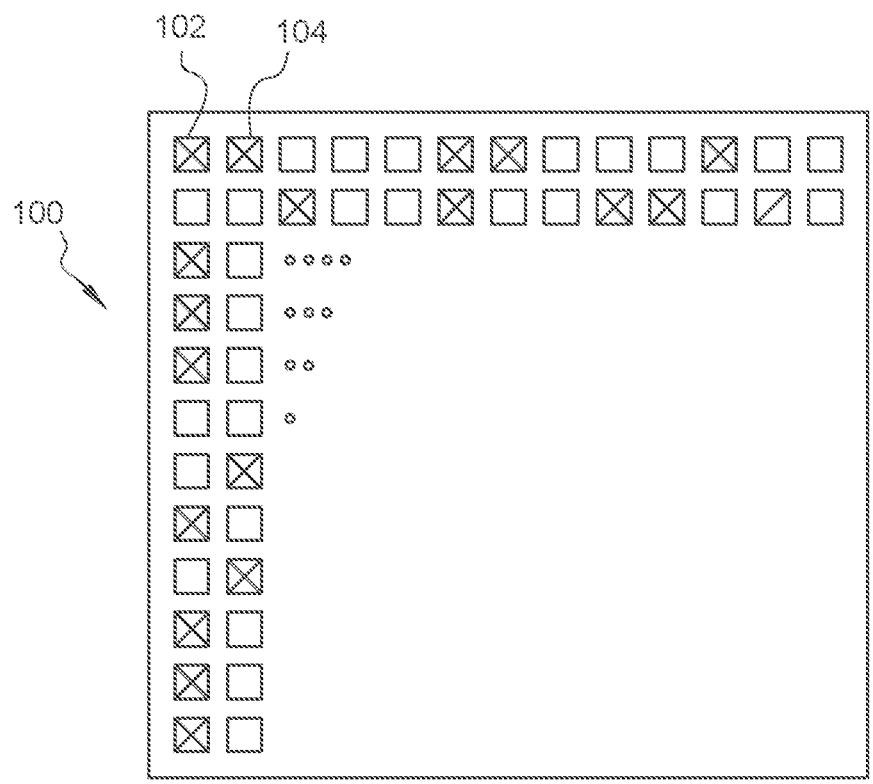
FIG. 1 is a simplified top view in the form of blocks of an embodiment of a ROM.

FIG. 1 is a very simplified top view of a ROM 100.

ROM 100 comprises memory cells arranged in the form of an array, that is, in rows and in columns. In FIG. 1, only two rows of memory cells and two columns are shown. Each memory cell is adapted to representing a binary information, that is, a "one" (1) or a "zero" (0).

Figure 2:
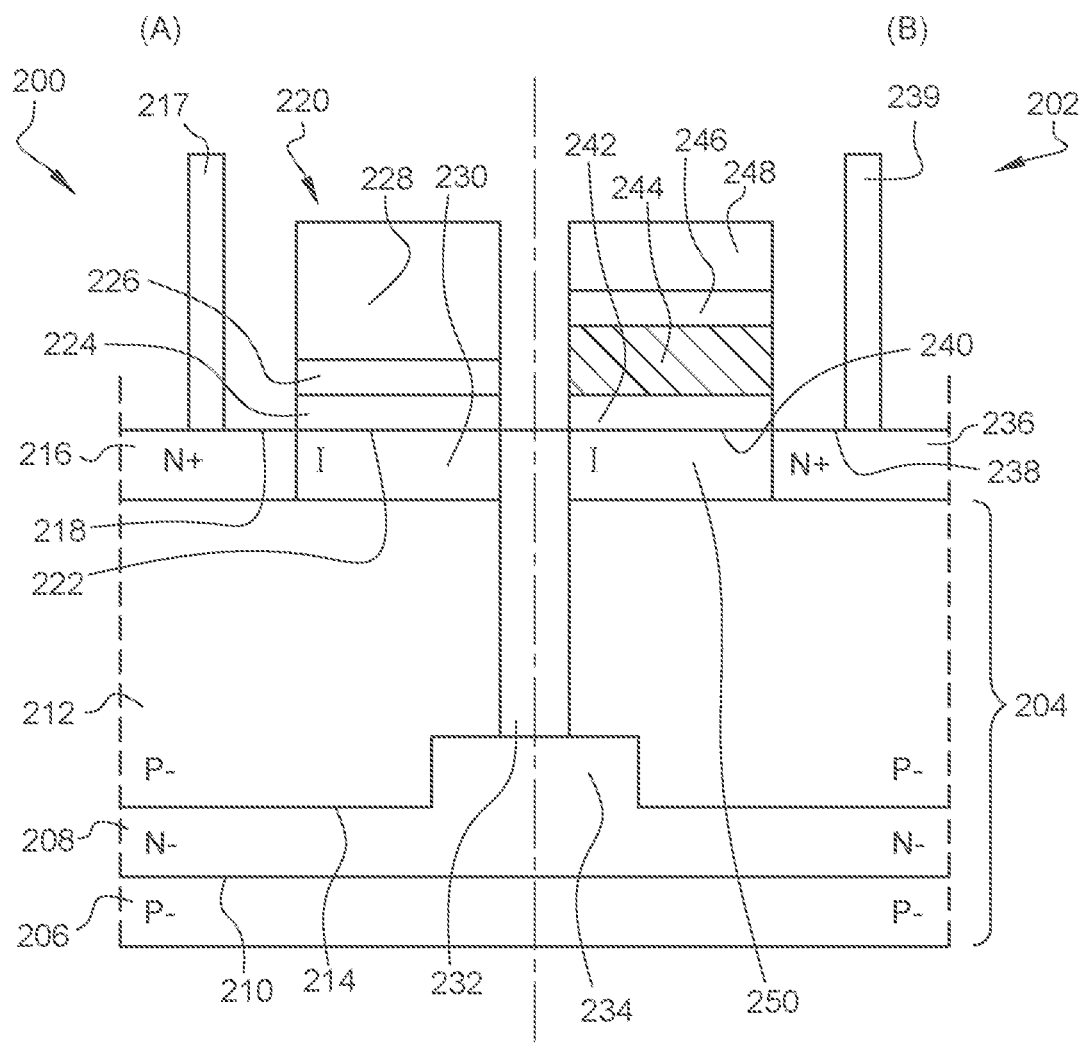
FIG. 2 is a cross-section view of an embodiment of two memory cells of the ROM of FIG. 1.

ROM 100 more particularly comprises two different types of memory cells, each representing the value of a bit. A first type of memory cells 102 is adapted to representing a binary "one" and a second type of memory cells 104 is adapted to representing a binary "zero". In FIG. 1, memory cells 102 are shown with empty blocks, and memory cells 104 are shown with blocks comprising a cross. FIG. 2 shows a first embodiment of two types of memory cells capable of being used in a ROM of the type of ROM 100. Similarly, FIGS. 8 and 10 each show an embodiment of two types of memory cells capable of being used in a ROM.

ROM 100 may be accompanied by circuits allowing its operation, such as readout circuits, cipher or decipher circuits, etc. These circuits are not shown in FIG. 1.

FIG. 2 is a cross-section view of an embodiment of two memory cells 200 and 202 adapted to being used in a ROM of the type of the ROM 100 described in relation with FIG. 1.

Memory cell 200 is shown on a portion (A) of FIG. 2 (left-hand portion of FIG. 2) and memory cell 202 is shown on a portion (B) of FIG. 2 (right-hand portion of FIG. 2). An example of implementation mode of a method of manufacturing memory cells 200 and 202 is described in relation with FIGS. 4 and 5.

Memory cells 200 and 202 are formed side by side on a structure 204. Structure 204 comprises a P-type doped semiconductor substrate 206 (P−), for example, lightly P-type doped. Only an upper portion of substrate 206 is shown in FIG. 2. Substrate 206 is for example made of silicon doped with boron atoms. The structure further comprises a semiconductor layer 208 formed on surface 210 of substrate 206. Layer 208 (N−) is N-type doped, for example, lightly N-type doped. Layer 208 is for example made of silicon doped with phosphorus atoms. Layer 208 has a thickness in the range from 0.5 to 10 μm, for example, in the order of 1 μm. The structure further comprises a semiconductor layer 212 (P−) formed on surface 214 of layer 208. Layer 212 is P-type doped, for example, lightly P-type doped. Layer 212 is for example made of silicon doped with boron atoms. Layer 212 has a thickness in the range from 0.1 to 1 μm, for example, in the order of 0.5 μm.

Memory cell 200 is an N-channel metal oxide semiconductor transistor having its N-type doped source region formed by layer 208 and having its P-type doped substrate region formed by layer 212. Substrate region of an N-channel MOS transistor here designates the P-type doped substrate or well, a portion of which forms the transistor channel region.

A well 216 (N+) is formed from a first portion 218, on the left-hand side of portion A of FIG. 2, of the surface of layer 212. Well 216 is N-type doped, for example, heavily N-type doped. Well 216 forms the drain region of memory cell 200. A contact 217 may be formed on well 216. Well 216 is for example made of silicon doped with phosphorus atoms. Well 216 extends down a depth in the range from 0.01 to 0.5 μm, for example in the order of 0.2 μm.

An insulated gate 220 is formed on a second portion 222 of the surface of layer 212. Portion 222 is on the right-hand side of the portion (A) of FIG. 2, and is arranged next to portion 218. Insulated gate 220 forms the gate of memory cell 200. Insulated gate 220 comprises two insulating layers 224 and 226, and a gate layer 228. Insulating layer 224 rests on portion 222 of the surface of layer 212. Insulating layer 224 is made of silicon oxide (SiO₂) and has a thickness in the range from 5 to 10 nm, for example, in the order of 8.7 nm, that is, 87 Angstroms. Insulating layer 226 rests on the surface of layer 224. Insulating layer 226 is made of an oxide-nitride-oxide alloy and has a thickness in the range from 10 to 15 nm, for example, in the order of 12.7 nm, that is, 127 Angstroms. Gate layer 228 rests on the surface of insulating layer 226. Gate layer 228 is made of polysilicon and has a thickness in the range from 50 to 500 nm, for example, in the order of 200 nm.

Optionally, an N-type doped well 230 (I) may be formed from portion 222. Well 230 may enable to adjust the threshold voltage of the transistor formed by memory cell 200.

Memory cell 200 is separated from memory cell 202 by a semiconductor trench 232 extending across the entire thickness of layer 212, that is, all the way to surface 214 of layer 208. Further, layer 208 may comprise a thickening 234 at the location where it is in contact with trench 232. Thickening 234 may be obtained by implantation of phosphorus atoms. Trench 232 is for example made of polysilicon. Trench 232 has a width in the range from 50 nm to 500 nm, for example, in the order of 120 nm.

Memory cell 202 is a memory cell of e-STM (embedded Select in Trench Memory) type. An e-STM type memory cell is a rewritable memory cell typically used in a flash memory. Memory cell 202 has a structure similar to the structure of memory cell 200 and forming a mirror therewith. Thus, like memory cell 200, memory cell 202 comprises a well 236 formed from a portion 238 of the surface of layer 212, similar to well 216. Portion 238 is located on the right-hand side of portion (B) of FIG. 2. A contact 239 may be formed on well 236. Memory cell 202 further comprises a stack of two insulated gates formed on a portion 240 of the surface of layer 212, this portion being positioned on the left-hand portion of portion (B) of FIG. 2. Portion 240 extends from trench 232 to portion 238 of the surface of layer 212. The stack of two insulated gates successively comprises on portion 240: an insulating layer 242 identical, to within manufacturing dispersions, to the insulating layer 224 of memory cell 200, directly resting on portion 240; a first gate layer 244 resting on insulating layer 242; an insulating layer 246 identical, to within manufacturing differences, to the insulating layer 226 of memory cell 200, directly resting on layer 244; and a second gate later 248 resting on insulating layer 246.

Memory cell 202 thus comprises a first insulated gate formed by layers 242 and 244, having a second insulated gate formed by layers 246 and 248 resting thereon.

Further, like memory cell 200, memory cell 202 may optionally comprise an N-type doped well 250 (I) formed from portion 240 of the surface of layer 212. Well 250 may enable to adjust the threshold voltage of the transistor formed by memory cell 200.

Gate layers 244 and 248 are for example made of polysilicon. Gates layers 244 and 248 for example have a close, or even equal, thickness. Gate layers 244 and 248 have a thickness in the range from 50 to 500 nm, for example, in the order of 100 nm.

The insulated gate 220 of memory cell 200 and the stack of two insulated gates of memory cell 202 have a close, or even equal, thickness. More particularly, the gate layer 228 of memory cell 200 has a thickness equal to the sum of the thicknesses of the gate layers 244 and 248 of memory cell 202.

Memory cells 200 and 202 have different threshold voltages which enables them to be used as a memory cell of a ROM. Indeed, the threshold voltage level of a memory cell may be used as data bit coding means. According to an example, when the level of the threshold voltage is greater than a reference level, the memory cell may represent a binary "one" (1) and, conversely, when this level of the threshold voltage is smaller than this reference level, the memory cell may represent a binary "zero" (0). According to a variant, the inverse may be envisaged. For a memory cell of the type of memory cell 200, that is, for a transistor, the threshold voltage is defined, and adjusted, by manufacturing, based on the dimensions and on the materials used. For a memory cell of the type of memory cell 202, the threshold voltage is defined, by manufacturing, based on the dimensions and the materials used, but may also be adjusted during its use by an operation of erasing of or writing into the memory cell. The adjustment of the threshold voltage of a memory cell of the type of memory cell 202 is described in further detail in relation with FIG. 3.

Figure 4:
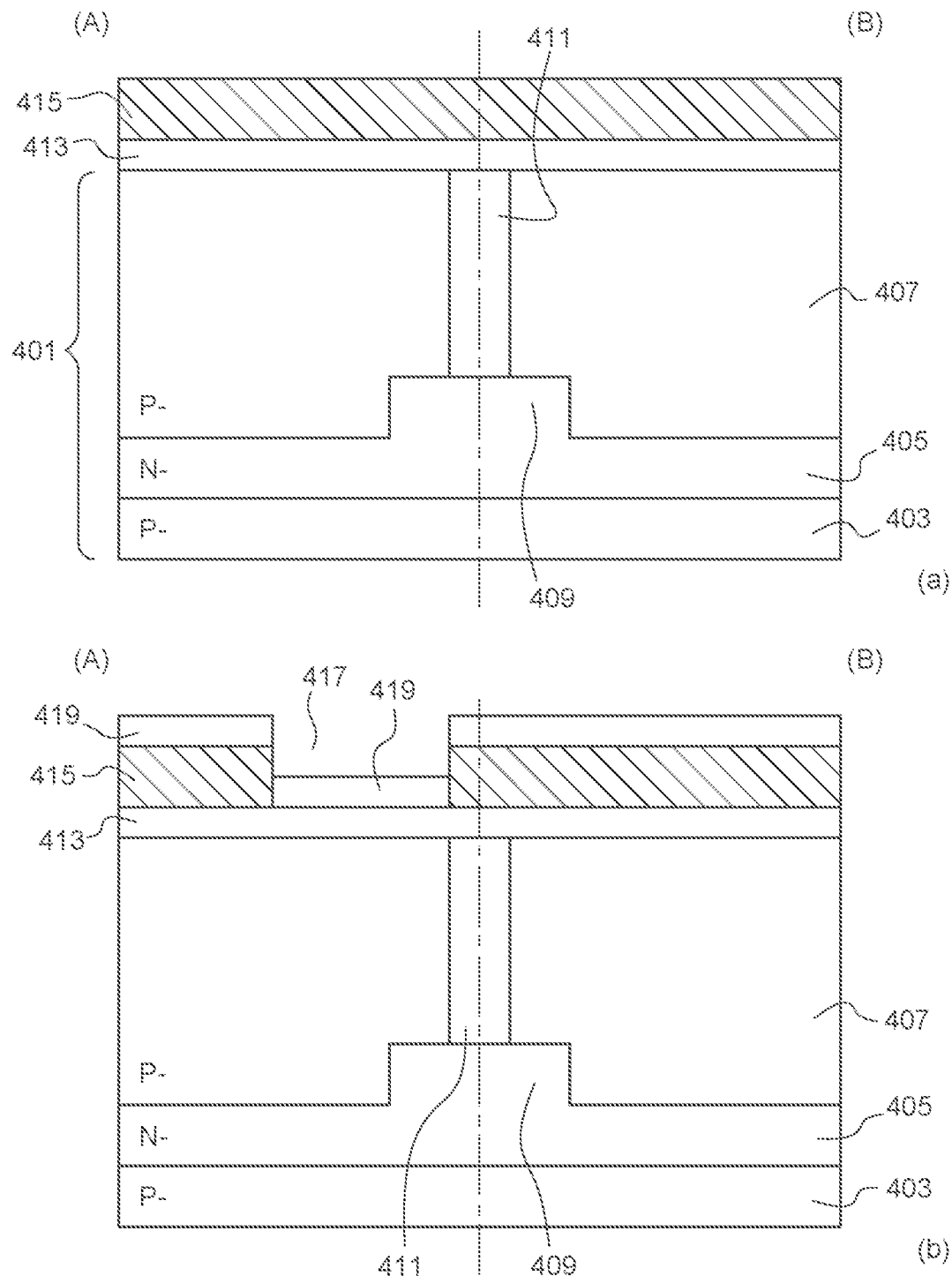
FIG. 4 shows two cross-section views illustrating steps of a method of manufacturing the memory cells of FIG. 2.
Figure 5:
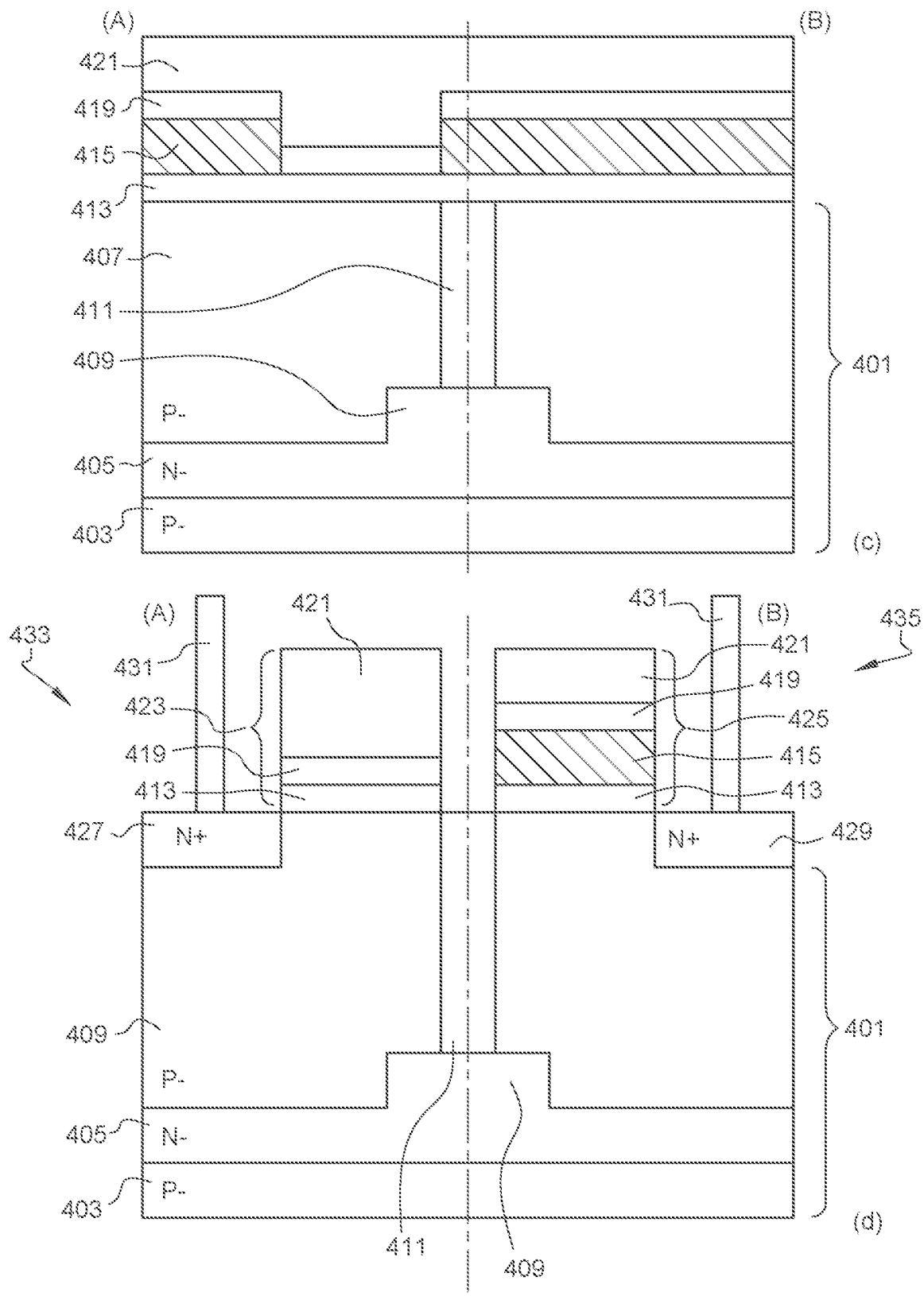
FIG. 5 shows two cross-section views illustrating other steps of a method of manufacturing the memory cells of FIG. 2.

A method of manufacturing memory cells 200 and 202 is described in relation with FIGS. 4 and 5.

Figure 3:
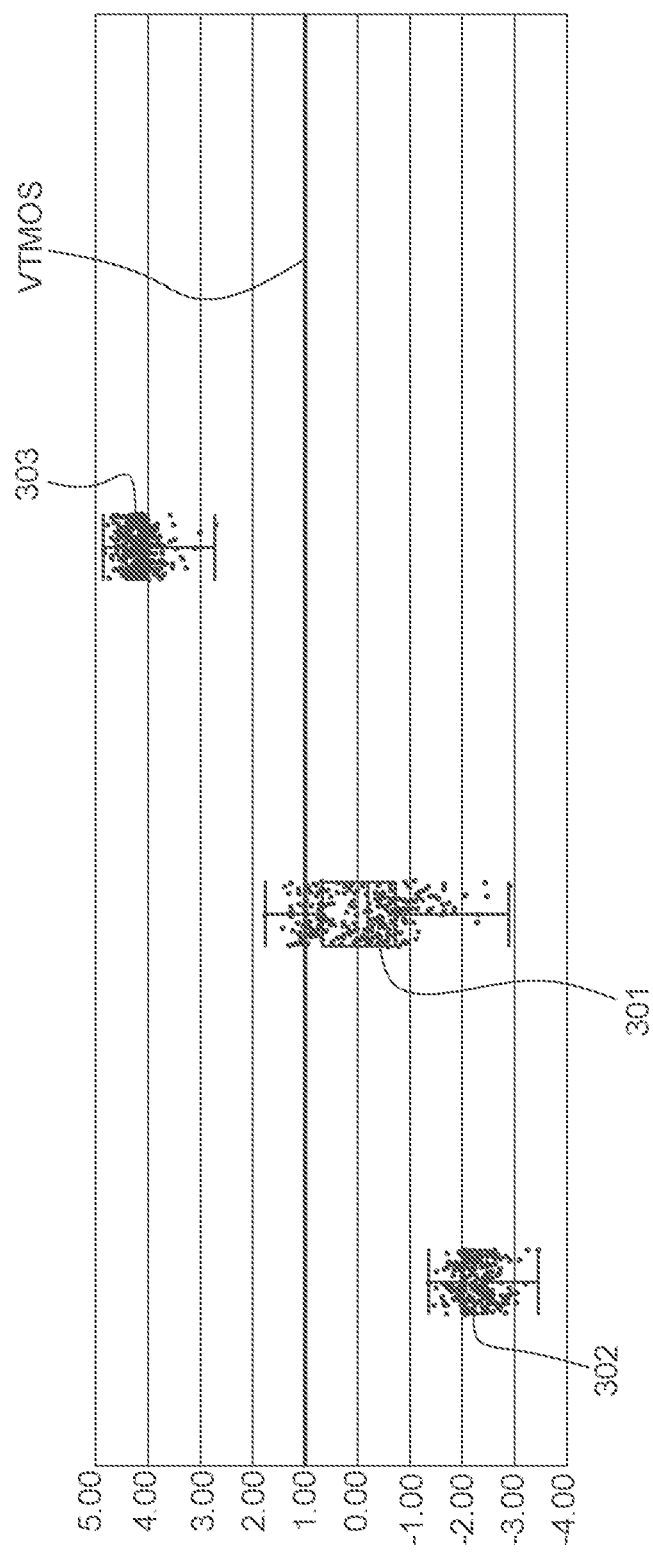
FIG. 3 is a graph illustrating the electronic characteristics of the memory cells of FIG. 2.

FIG. 3 is a graph illustrating threshold voltage levels of memory cells of the type of the memory cells 200 and 202 described in relation with FIG. 2. The axis of ordinates of this graph is in volts (V).

The threshold voltage VTMOS of memory cells of the type of memory cell 200, that is, of a memory cell formed of a MOS transistor, is set, by convention, to 1V as a reference. This voltage VTMOS is symbolized in FIG. 3 by a line bearing reference VTMOS.

The graph of FIG. 3 has been plotted by measuring the threshold voltage of a plurality of memory cells of the type of memory cell 202 of identical size, to within manufacturing differences, formed on a same substrate.

A first group of points 301 represents the measurements of the threshold voltages of the memory cells of the type of memory cell 202 at the end of the manufacturing, that is, before an erase or write operation. The threshold voltages extend from approximately −3 V to approximately 1.8 V. The range over which the threshold voltages extend is quite wide and does not enable to differentiate the threshold voltage of a memory cell of the type of memory cell 202 from the threshold voltage of a memory cell of the type of memory cell 200.

A second group of points 302 represents the measurements of the threshold voltages of the memory cells of the type of memory cell 202 after they all have been submitted to an erase operation. The threshold voltages extend from approximately −3.5 V to approximately −1.2 V. This range is quite distant from the reference threshold voltage VTMOS. According to an embodiment, considering a ROM comprising memory cells of the type of memory cell 200 and memory cells of the type of memory cells 202, the memory cells of the type of memory cell 202 have a lower threshold than the memory cells of the type of memory cell 200, whereby the memory cells of the type of memory cell 202 may represent a binary "zero" (0) and the memory cells of the type of memory cell 200 may represent a binary "one" (1). According to an alternative embodiment, the inverse may be envisaged.

A third group of points 303 represents the measurements of the threshold voltages of the memory cells of the type of memory cell 202 after they have all been submitted to a write operation. The threshold voltages extend from approximately 2.6 V to approximately 4.8 V. This range is quite distant from the reference threshold voltage VTMOS. According to another embodiment, considering a ROM comprising memory cells of the type of memory cell 200 and memory cells of the type of memory cells 202, the memory cells of the type of memory cell 202 have a higher threshold voltage than the memory cells of the type of memory cell 200, whereby the memory cells of the type of memory cell 202 may represent a binary "one" (1), and the memory cells of the type of memory cell 200 may represent a binary "zero" (0). According to an alternative embodiment, the inverse may be envisaged.

FIGS. 4 and 5 comprise views (a), (b), (c), and (d) illustrating successive steps of a method of manufacturing two memory cells of the type of the memory cells 200 and 202 described in relation with FIG. 2 side by side on a same substrate.

Like FIG. 2, each view (a), (b), (c), and (d) comprises a portion (A) on the left-hand side of the view, and a portion (B) on the right-hand side of the view. A memory cell of the type of memory cell 200 is manufactured in portion (A) of views (a) to (d) and a memory cell of the type of memory cell 202 is manufactured in portion (B) of views (a) to (d).

View (a) illustrates a step of manufacturing a structure 401 of the type of the structure 204 described in relation with FIG. 2. Thus, structure 401 comprises a partially shown P-type doped substrate 403 having a stack of an N-type doped semiconductor layer 405 and of a P-type doped semiconductor layer 407 resting thereon. Substrate 403 and layers 405 and 407 are respectively identical to substrate 206 and to the layers 208 and 212 described in relation with FIG. 2. Thus, like layer 208, layer 405 exhibits a thickening 409 at the location of a trench of the type of the trench 232 described in relation with FIG. 2. Layers 206 and 208 are successively deposited on substrate 403 to form structure 401.

View (a) further illustrates a step of forming of a trench 411 identical to the trench 232 described in relation with FIG. 2. This forming step for example comprises a step of etching of a trench at the level of the thickening 409 of layer 405 and a step of filling of this trench. The filling step may be preceded by a step of oxidation of the trench walls. The oxidation step may for example enable to avoid an ohmic contact between the trench filling material and the material of layer 407. According to an example, the trench is filled with polysilicon. For this purpose, the trench may be filled with amorphous silicon and then be submitted to one or a plurality of crystallization steps to form polysilicon.

An implantation step could be carried out after the step of etching of the trench to form wells of the type of the wells 230 and 250 described in relation with FIG. 2.

View (a) further illustrates a step of deposition of an insulating layer 413 over the entire surface of structure 401. This step is successive to the step of forming of trench 411. Insulating layer 413 is made of a same material as the layers 224 and 242 described in relation with FIG. 2. Insulating layer 413 has a thickness in the range from 5 to 10 nm, for example, in the order of 8.7 nm, that is, 87 Angstroms.

View (a) further illustrates a step of deposition of a gate layer 415 over the entire surface of insulating layer 413. Gate layer 415 is made of a same material as the gate layer 244 described in relation with FIG. 2. Gate layer 415 has a thickness in the range from 20 nm to 200 nm, for example, in the order of 100 nm.

View (b) illustrates a step of etching of a cavity 417 in layer 415 extending at least down to the surface of insulating layer 413. Cavity 417 is formed on the side of portion (A) of view (b). More particularly, the location of this cavity 417 designates the location of the insulated gate of the memory cell of the type of memory cell 200 to be manufactured. Cavity 417 is for example formed by a method comprising a masking step and an etch step.

View (b) further illustrates a step of deposition of an insulating layer 419 over the entire surface of the structure obtained after the etch step, and particularly in the bottom of cavity 417. Insulating layer 419 is made of a same material as the layers 226 and 246 described in relation with FIG. 2. Insulating layer 413 has a thickness in the range from 10 to 15 nm, for example, in the order of 12.7 nm, that is, 127 Angstroms.

View (c) illustrates a step of deposition of a gate layer 421 over the entire surface of the structure illustrated in view (b). Gate layer 421 fills the entire cavity 417, and its surface is leveled to be horizontal in the sense of view (c). Gate layer 421 is made of a same material as the gate layers 228 and 248 described in relation with FIG. 2, that is, for example, of polysilicon. Gate layer 421 has a thickness in the range from 20 to 200 nm, for example, in the order of 80 nm.

View (d) illustrates an etch step to individualize an insulated gate 423 of the memory cell of the type of memory cell 200, and a stack 425 of two insulated gates of the memory cell of the type of memory cell 202. During this step, insulated gate 423 and stack 425 are laterally delimited, after which the excess of layers 413, 415, 419, and 421 is removed. This step may comprise the use of a plurality of successive masking and etch steps. The result in top view of this step is described in further detail in relation with FIGS. 6 and 7.

View (d) further illustrates the completion of the manufacturing method. This completion comprises: the doping of two wells 427 and 429 similar to the wells 216 and 218 described in relation with FIG. 2; and the forming of contacts 431 on wells 427 and 429, similar to the contacts 217 and 239 described in relation with FIG. 2.

Portion (A) of view (d) then illustrates a memory cell 433 of the type of memory cell 200, and portion (B) then illustrates a memory cell 435 of the type of memory cell 202.

An advantage of the method described herein is that it enables to manufacture a ROM using the memory cells described in relation with FIG. 2, where only one etch step, the etch step described in relation with view (b), enables to differentiate a memory cell representing a binary "zero" from a memory cell representing a binary "one".

Figure 6:
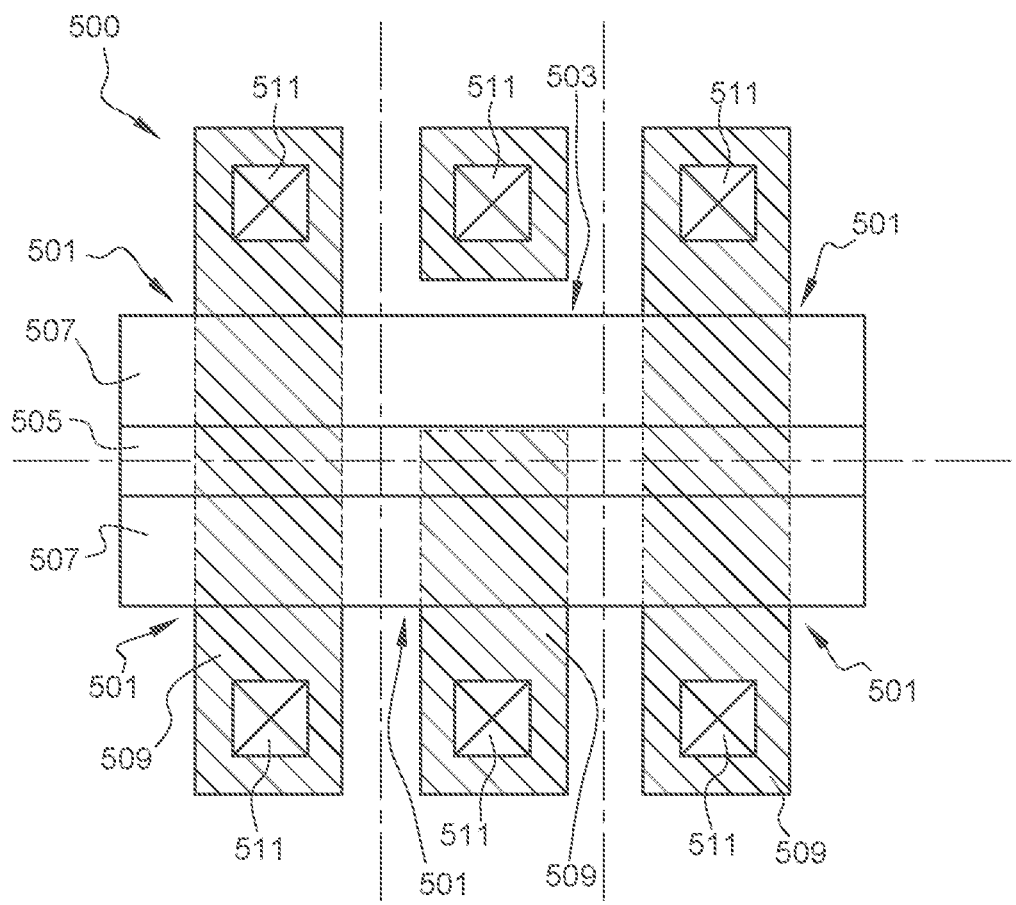
FIG. 6 is a more detailed top view of an embodiment of a ROM of FIG. 1.

FIG. 6 shows a more detailed top view of a simplified embodiment of a ROM 500 of the type of the ROM 100 described in relation with FIG. 1.

ROM 500 comprises six memory cells arranged in two rows and three columns. According to an example, ROM 500 comprises five memory cells 501 of the type of the memory cell 202 described in relation with FIG. 2, and one memory cell 503 of the type of the memory cell 200 described in relation with FIG. 2.

In ROM 500, the rows of memory cells are formed in pairs. In each pair of rows, the two memory cell rows are separated by a semiconductor trench 505 of the type of the semiconductor trench 232 described in relation with FIG. 2. Trench 505 extends all along the memory cell rows, and is thus common to all the memory cells of a same row. According to an example, contacts may be formed at the ends of trench 505. Trench 505 has, in top view, a width, for example, in the range from 20 to 200 nm, for example, in the order of 100 nm.

Further, the memory cells 501 and 503 of a same row have a common insulated gate 507. More particularly, memory cells 503 have their insulated gate, that is, the insulated gate 220 described in relation with FIG. 2, common with the second insulated gate of memory cells 501, that is, the insulated gate formed by the layers 246 and 248 described in relation with FIG. 2. According to an example, contacts may be formed at the ends of insulated gate 507. Insulated gate 507 has, in top view, a width, for example, in the range from 50 to 500 nm, for example, in the order of 90 nm.

Further, the memory cells 501 of a same column have a common first insulated gate 509. The first insulated gate 509 of memory cells 501 corresponds to the insulated gate formed of insulating layer 242 and the gate layer 244 described in relation with FIG. 2. When a column comprises a memory cell 503, that is, a memory cell comprising a single insulated gate, insulated gate 509 exhibits a recess at the level of the insulated gate of this memory cell. Indeed, as described in relation with FIGS. 4 and 5, the gate layer enabling to form the first gate layer of memory cell 501 is etched at the location where the insulated gate of a memory cell 503 is formed. According to an example, contact 511 may be formed at the level of the ends of the N-type doped wells of the type of the wells 216 and 236 described in relation with FIG. 2. Insulated gate 509 has, in top view, a width, for example, in the range from 20 to 200 nm, for example, in the order of 60 nm.

An advantage of the use of memory cells 501 and 503 is that they enable to form memory cells having an area, in top view, in the order of 0.037 $\mu m^2$, which is smaller than the area of a memory cell of a ROM which typically rather in the order of 0.052 $\mu m^2$.

Another advantage is that a ROM using memory cells 501 and 503 is less sensitive to reverse engineering attacks.

Figure 7:
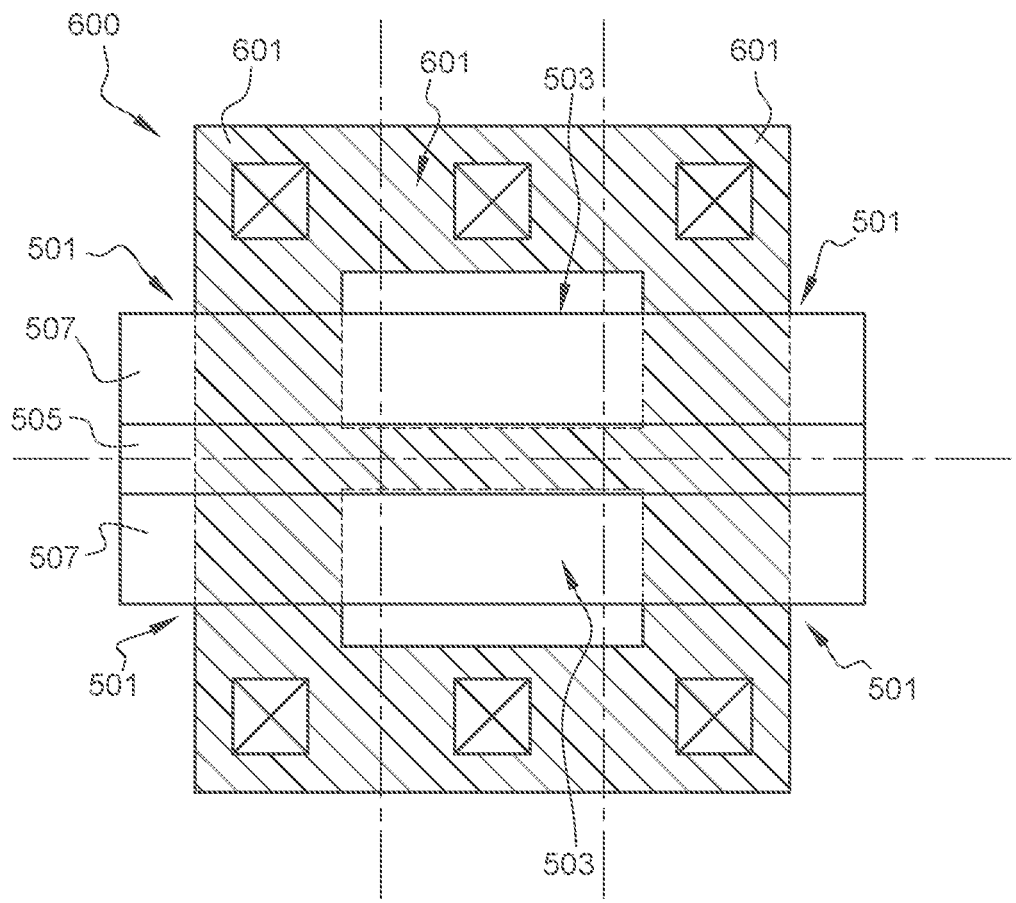
FIG. 7 is a more detailed top view of another embodiment of a ROM of FIG. 1.

FIG. 7 shows a more detailed top view of another simplified embodiment of a ROM 600.

ROM 600 is similar to ROM 500, and comprises memory cells 501 and 503.

Conversely to ROM 500, ROM 600 comprises four memory cells 501 and two memory cells 503. Further, the two memory cells 503 are located in a same column.

Like ROM 500, in ROM 600, the memory cell rows are formed in pairs. In each pair of rows, the two memory cell rows are separated by semiconductor trench 505 which extends all along the memory cell rows, and which is thus common to all the memory cells of a same row. Further, the memory cells 501 and 503 of a same row have a common insulated gate 507.

Further, like the insulated gate 509 of ROM 500, the memory cells 501 of a same column have a common first insulated gate 601. The first insulated gate 601 of memory cells 501 corresponds to the insulated gate formed of insulating layer 242 and the gate layer 244 described in relation with FIG. 2. When a column comprises a memory cell 503, that is, a memory cell comprising a single insulated gate, insulated gate 601 exhibits a recess at the level of the insulated gate of this memory cell 503. Further, when the column comprises two memory cells 503 side by side, it may be technically difficult, for reasons of accuracy of the etching devices, to form recesses in insulated gate 601 at the location of the gates of transistors 503. Thus, the width of insulated gate 601 is enlarged so that the portions remaining after the forming of the recesses are sufficiently wide, in this horizontal direction in FIG. 7, to reach the insulated gates of the adjacent columns. According to an example, contacts may be formed at the ends of insulated gate 601.

Figure 8:
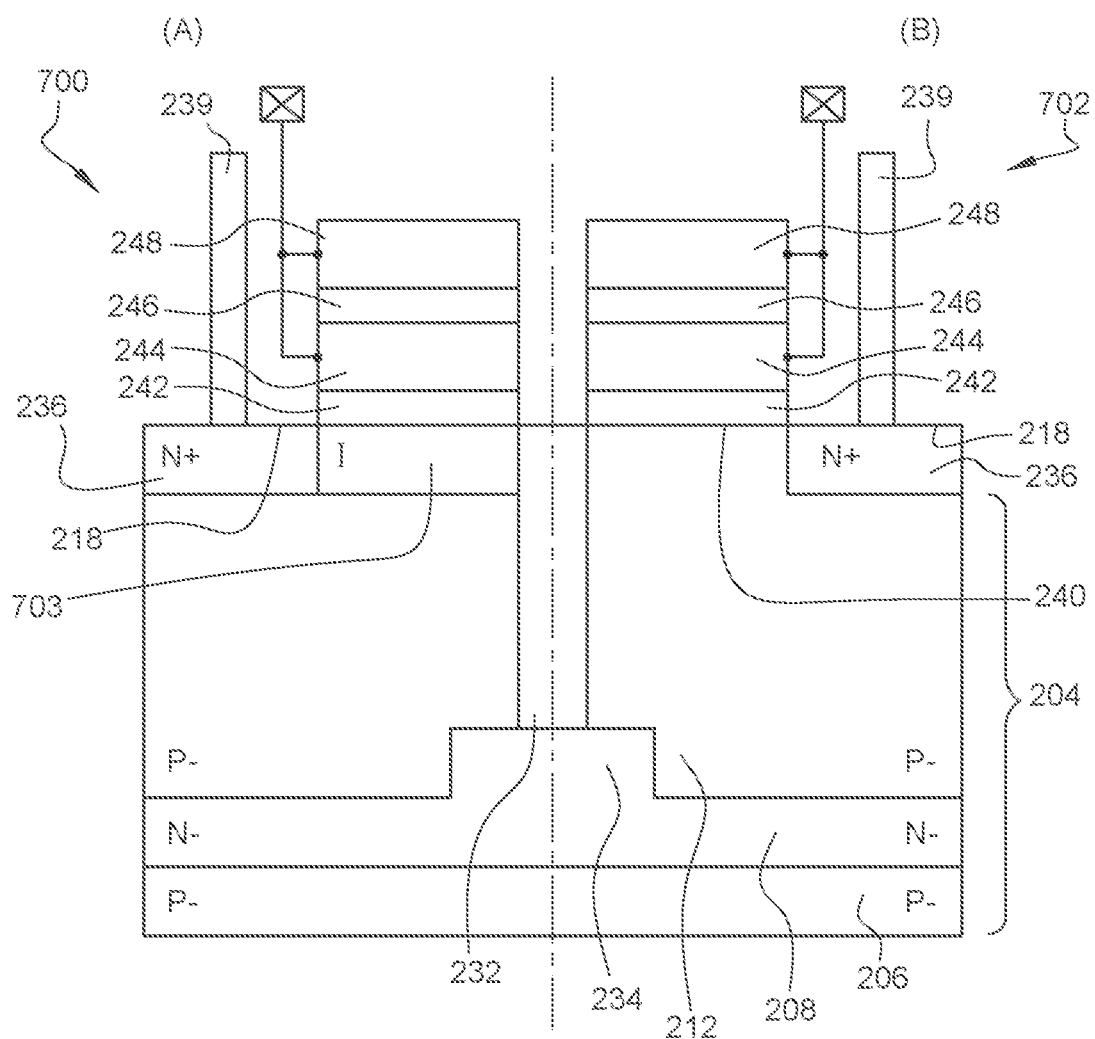
FIG. 8 is a cross-section view of an embodiment of two other memory cells of the ROM of FIG. 1.

FIG. 8 is a cross-section view of another embodiment of two memory cells 700 and 702 adapted to being used in a ROM of the type of the ROM 100 described in relation with FIG. 1.

Memory cell 700 is shown on a portion (A) of FIG. 8 (left-hand portion of FIG. 8) and memory cell 702 is shown on a portion (B) of FIG. 8 (right-hand portion of FIG. 8).

Memory cells 700 and 702 are similar to the memory cell 202 described in relation with FIG. 2. The elements common to memory cells 202, 700, and 702 will not be described again in detail hereafter, and only their differences will be highlighted.

Like memory cell 202, memory cells 700 and 702 are formed on structure 204 formed of a stack successively comprising: P-type doped semiconductor substrate 206; N-type doped semiconductor layer 208; and P-type doped semiconductor layer 212.

Layer 212 comprises N-type doped well 236 extending at the level of portion 238 of its surface. Contact 239 enables to come into contact with this well.

Like memory cells 200 and 202, memory cells 700 and 702 are separated by the semiconductor trench 232 formed in layer 208 and which extends all the way to thickening 234 of layer 208.

Like memory cell 202, memory cells 700 and 702 comprise a stack of two insulated gates formed on a portion 240 of the surface of layer 212. The first insulated gate is formed by insulating layer 242 and gate layer 244, and the second insulated gate is formed by insulating layer 246 and by gate layer 248. However, memory cells 700 and 702 differ from memory cell 202 in that their insulated gates are coupled, preferably connected, to each other. The operation of memory cells 700 and 702 then resembles the operation of a transistor. According to an example, the two insulated gates of memory cells 700 and 702 are connected by forming a via in the second insulated gate extending all the way to the first insulated gate. By connecting this via to another via connected to the second insulated gate, the two insulated gates are connected.

Memory cells 700 and 702 differ from each other in that memory cell 700 comprises a well 703 (I) formed in layer 212 under the stack of two insulated gates and that memory cell 702 does not comprise this well 703. Well 703 is similar to the well 250 described in relation with FIG. 2. Thus, well 703 is obtained by N-type doping. Well 703 may have a dopant element concentration in the range from $1\times10^{13}$ to $5\times10^{13}$ at·cm$^{-3}$, for example, in the order of $3\times10^{13}$ at·cm$^{-3}$. Well 703 enables to adjust the threshold voltage of memory cell 700. The effect of the well is described in further detail in relation with FIG. 9.

An advantage of the use of memory cells 700 and 702 is that, in top view, memory cells 700 and 702 are inseparable.

Figure 9:
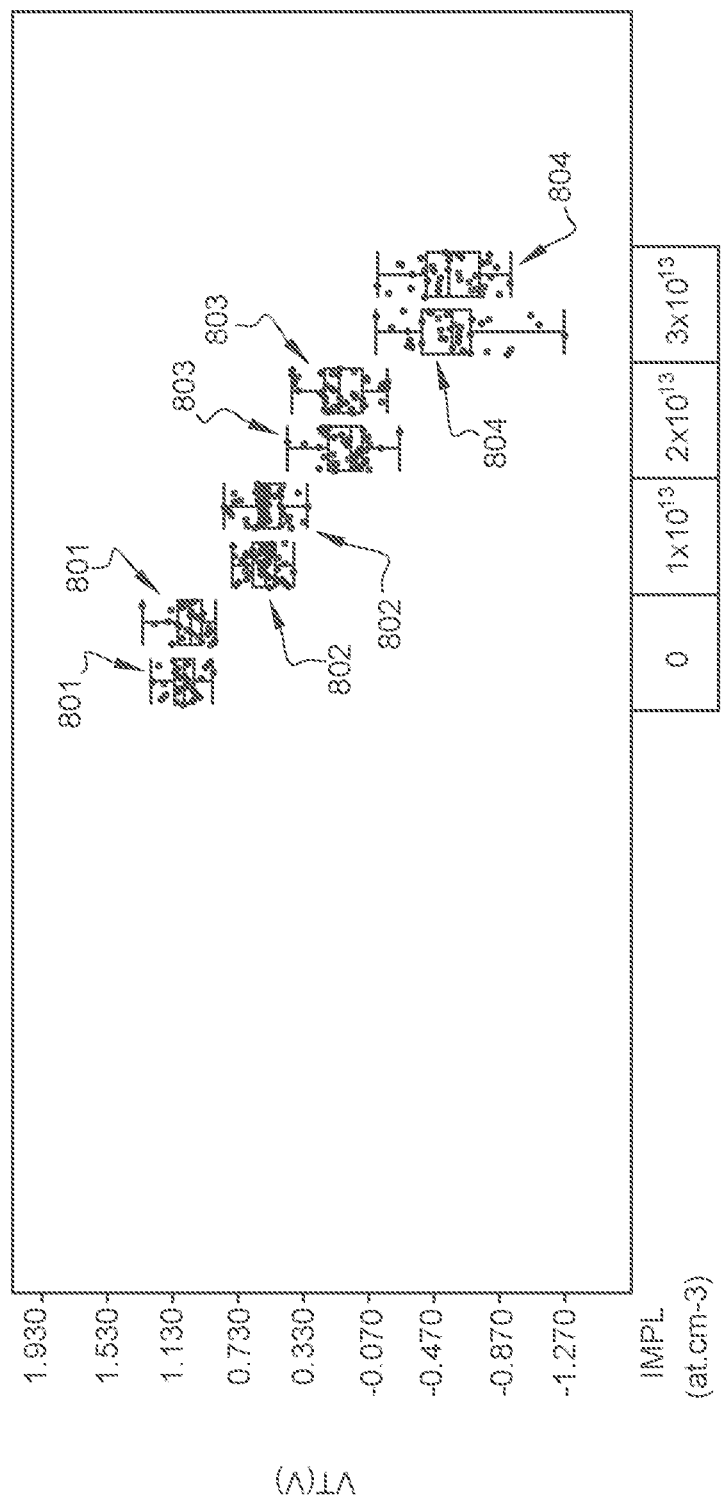
FIG. 9 is a graph illustrating the electronic characteristics of the memory cells of FIG. 8.

FIG. 9 is a graph illustrating threshold voltage levels of memory cells of the type of the memory cells 700 and 702 described in relation with FIG. 2. The axis of ordinates of this graph is in volts (V). The axis of abscissas represents different doping levels of well 703 in at·cm$^{-3}$.

To obtain this graph, measurement have been performed on two different sets of memory cells 700 and 702, whereby each doping level of well 703 comprises two groups of points representing different voltage thresholds.

Two first groups 801 represent the measurements of the threshold voltage of memory cells 702 comprising no well 703. The values of the threshold voltages extend between 0.850 and 1.350 V.

Two second groups 802 represent the measurements of the threshold voltage of memory cells 700 comprising a well 703 having a doping level in the order of $1\times10^{13}$ at·cm$^{-3}$. The values of the threshold voltages extend between 0.330 and 0.900 V.

Two third groups 803 represent the measurements of the threshold voltage of memory cells 700 comprising a well 703 having a doping level in the order of $2\times10^{13}$ at·cm$^{-3}$. The values of the threshold voltages extend between −0.250 and 0.450 V.

Two fourth groups 804 represent the measurements of the threshold voltage of memory cells 700 comprising a well 703 having a doping level in the order of $3\times10^{13}$ at·cm$^{-3}$. The values of the threshold voltages extend between −1.270 and 0 V.

The increase of the implant dosage level of well 703 enables to modify the threshold voltage of memory cells 700. Like memory cells 200 and 202, memory cells 700 and 702 may be used in a ROM of the type of memory 100 by using their threshold voltage as binary data coding means. According to an example, memory cells 702 may for example represent a binary "zero" (0), and memory cells 700 may for example represent a binary "one" (1). According to a variant, the inverse may be envisaged.

Figure 10:
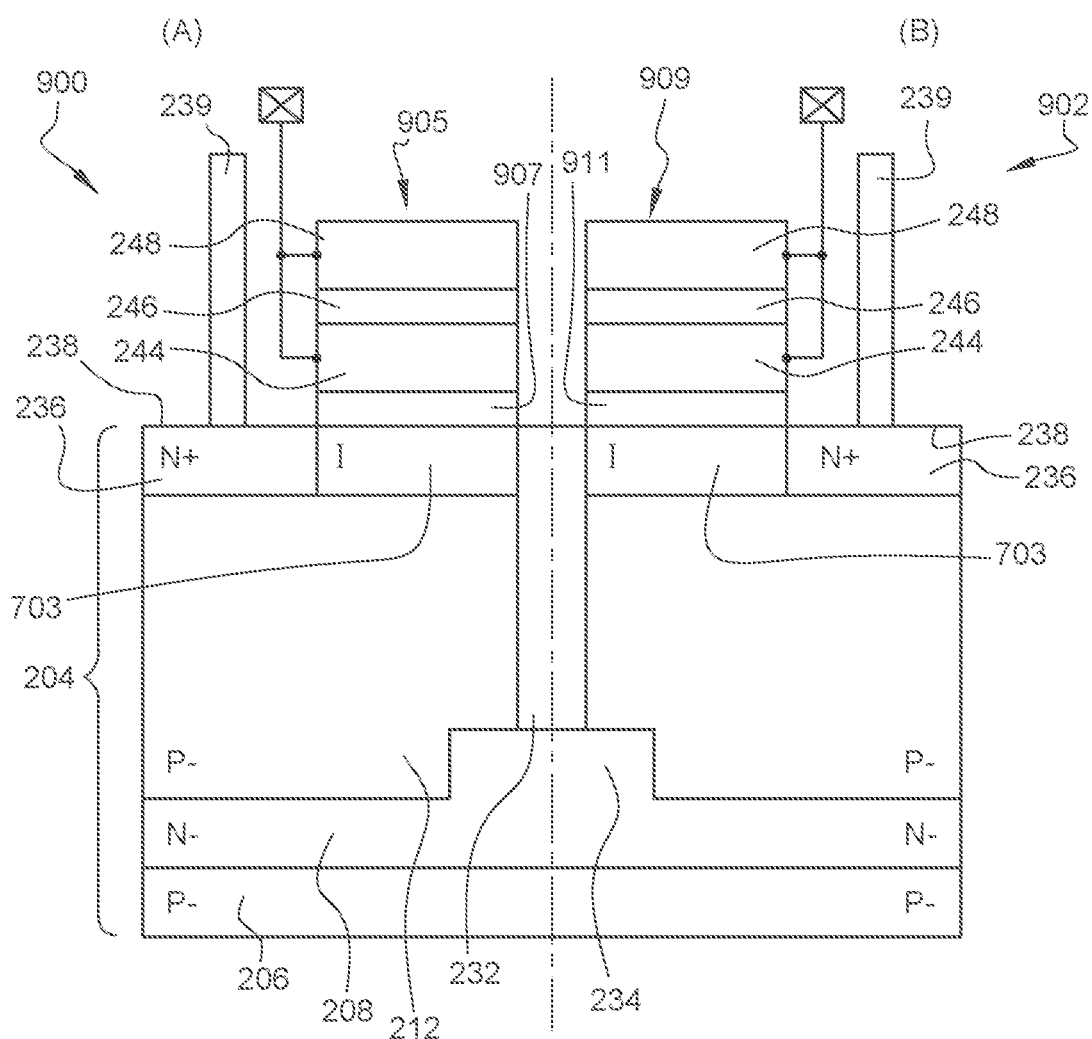
FIG. 10 is a cross-section view of an embodiment of two other memory cells of the ROM of FIG. 1.

FIG. 10 is a cross-section view of another embodiment of two memory cells 900 and 902 adapted to being used in a ROM of the type of the ROM 100 described in relation with FIG. 1.

Memory cell 900 is shown in a portion (A) of FIG. 10 (left-hand portion of FIG. 10), and memory cell 902 is shown in a portion (B) of FIG. 10 (right-hand portion of FIG. 10).

Memory cells 900 and 902 are similar to the memory cell 700 described in relation with FIG. 2. The elements common to memory cells 700, 900, and 902 will not be described again in detail hereafter, and only their differences will be highlighted.

Like memory cell 700, memory cells 900 and 902 are formed from structure 204 formed of a stack successively comprising: P-type doped semiconductor substrate 206; N-type doped semiconductor layer 208; and P-type doped semiconductor layer 212.

Layer 212 comprises N-type doped well 236 extending at the level of portion 238 of its surface. Contact 239 enables to come into contact with this well.

Like memory cells 700 and 702, memory cells 900 and 902 are separated by the semiconductor trench 232 formed in layer 208 and which extends all the way to thickening 234 of layer 208.

Like memory cell 700, memory cells 900 and 902 comprise a stack of two insulated gates formed on portion 240 of the surface of layer 212. However, memory cells 900 and 902 comprise stacks of two different insulated gates. More particularly, memory cell 900 comprises a stack 905 of two insulated gates formed on portion 240 of the surface of layer 212. Stack 905 successively comprises: an insulating layer 907 directly resting on portion 240; first gate layer 244 resting on insulating layer 907; insulating layer 246 directly resting on layer 244; and second gate layer 248 resting on insulating layer 246.

Memory cell 902 comprises a stack 909 of two insulated gates formed on portion 240 of the surface of layer 212. Stack 909 successively comprises: an insulating layer 911 directly resting on portion 240; first gate layer 244 resting on insulating layer 911; insulating layer 246 directly resting on layer 244; and second gate layer 248 resting on insulating layer 246.

Like memory cell 702, memory cells 900 and 902 have their two insulated gates coupled, preferably connected, to each other. The operation of memory cells 900 and 902 then resembles the operation of a transistor.

According to an embodiment, insulating layers 907 and 911 are made of different materials, for example, the same material as the insulating layer 242 described in relation with FIG. 2, and of a material insulating for high voltages, such as silicon oxide. Layers 907 and 911 further have different thicknesses. By varying the thickness and the materials of layers 907 and 911, it is possible to adjust the threshold voltages of memory cells 900 and 902.

According to an embodiment, the insulating layer 907 is made of a material insulating for high voltages, and has a thickness in the range from 10 to 20 nm, for example, in the order of 15 nm. Insulating layer 911 is identical to the insulating layer 242 described in relation with FIG. 2, that is, made of silicon oxide and having a thickness in the range from 5 to 10 nm, for example in the order of 8.7 nm.

Memory cells 900 and 902 comprise the well 703 formed in layer 212, and extending from portion 240 of the surface of layer 212. According to an alternative embodiment, memory cells 900 and 902 may comprise no well 703.

An advantage of the use of memory cells 900 and 902 is that, in top view, memory cells 900 and 902 are inseparable.

The described embodiments further target ROMs having all or part of the specificities mentioned hereafter.

A ROM comprising at least first and second memory cells (700, 702; 900, 902) of e-STM type, each comprising a first insulated gate (242, 244; 907; 909) and a second insulated gate (246, 248) stacked on each other, wherein the first insulated gate (242, 244; 907; 909) is electrically coupled to the second insulated gate (246, 248).

A memory wherein when the threshold voltage of the first memory cell (700; 900) or of the second memory cell (702; 902) is higher than a threshold, then said first or second memory cell (702; 902) represents a first bit value, and when said threshold voltage is lower than said threshold, then said first or second memory cell (702; 902) represents a second bit value different from the first value.

A memory wherein said first memory cell (700; 900) further comprises an N-type doped well (703).

A memory wherein said well has a dopant element implant concentration in the range from $1\times10^{13}$ to $5\times10^{13}$ at·cm$^{-3}$.

A memory wherein said well (703) is arranged under the first gate (242, 244) of the first memory cell (700).

A memory wherein the first insulated gate (907, 244) of the first memory cell (900) comprises a first insulating layer (907), and the first insulated gate (909, 244) of the second memory cell (902) comprises a second insulating layer (909).

A memory wherein the material of the first insulating layer (907) is different from the material of the second insulating layer (909).

A memory wherein the material of the first insulating layer (907) and the material of the second insulating layer (909) is silicon oxide.

A memory wherein the thickness of the first insulating layer (907) is different from the thickness of the second insulating layer (909).

A memory wherein the thickness of the first insulating layer (907) and the thickness of the second insulating layer (909) are in the range from 5 to 20 nm.

A memory wherein the thickness of the first insulating layer (907) is in the order of 15 nm and the thickness of the second insulating layer (909) is in the order of 8.7 nm.

A memory wherein the first and second memory cells (700, 702; 900, 902) are formed from a structure (204) successively: a doped substrate (206) of a first conductivity type; a first semiconductor layer (208) of a second conductivity type resting on said substrate (206); and a second semiconductor layer (212) of a first conductivity type resting on said first semiconductor layer (208).

A memory where the first and second insulated gates (242, 244, 246, 248; 907, 909) are formed on a first portion (240) of the surface of said structure (204).

A method of manufacturing a ROM comprising at least first and second memory cells (700, 702; 900, 902) of e-STM type, each comprising a first insulated gate (242, 244; 907, 909) and a second insulated gate (246, 248) stacked on each other, wherein a via crossing the first insulated gate (242, 244; 907, 909) is formed to couple the first insulated gate (242, 244; 907, 909) to the second insulated gate (246, 248).

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

What is claimed is:

1. A read-only memory (ROM), comprising:
a plurality of memory cells, each of the plurality of memory cells comprising a rewritable first transistor and a rewritable second transistor, an insulated gate of the rewritable first transistor connected to an insulated gate of the rewritable second transistor,
wherein the rewritable first transistor comprises:
a first insulating layer deposited on a semiconductor structure;
a first gate layer deposited on the first insulating layer;
a second insulating layer deposited on the first gate layer; and
a second gate layer deposited on the second insulating layer, and
wherein the rewritable second transistor comprises:
the first insulating layer deposited on a well arranged between the semiconductor structure and the first insulating layer;
the first gate layer deposited on the first insulating layer;
the second insulating layer deposited on the first gate layer; and
the second gate layer deposited on the second insulating layer.

2. The ROM of claim 1, wherein each of the rewritable first transistor and the rewritable second transistor is a metal-oxide-semiconductor (MOS) transistor.

3. The ROM of claim 1, wherein each of the rewritable first transistor and the rewritable second transistor is an N-channel MOS transistor.

4. The ROM of claim 1, wherein the semiconductor structure comprises a p-type doped semiconductor substrate stacked on an n-doped semiconductor layer, wherein the n-doped semiconductor layer is stacked on a p-doped semiconductor layer.

5. The ROM of claim 4, wherein the rewritable first transistor is separated from the rewritable second transistor by a semiconductor trench formed in the p-type doped semiconductor substrate.

6. The ROM of claim 5, wherein the n-doped semiconductor layer includes a portion extending into the p-type doped semiconductor substrate.

7. The ROM of claim 6, wherein the semiconductor trench extends through the p-type doped semiconductor substrate to the portion of the n-doped semiconductor layer extending into the p-type doped semiconductor substrate.

8. A read-only memory (ROM), comprising:
a plurality of memory cells, each of the plurality of memory cells comprising a rewritable first transistor and a rewritable second transistor, an insulated gate of the rewritable first transistor connected to an insulated gate of the rewritable second transistor, wherein each of the rewritable first transistor and the rewritable second transistor includes:
a first insulating layer deposited on a semiconductor structure, the semiconductor structure comprising a p-type doped semiconductor substrate stacked on an n-doped semiconductor layer, the n-doped semiconductor layer stacked on a p-doped semiconductor layer, wherein uniquely for each rewritable second transistor, the first insulating layer, for the rewritable second transistor is deposited on a well arranged between the semiconductor structure and the first insulating layer;
a first gate layer deposited on the first insulating layer;
a second insulating layer deposited on the first gate layer; and
a second gate layer deposited on the second insulating layer.

9. The ROM of claim 8, wherein each of the rewritable first transistor and the rewritable second transistor is a metal-oxide-semiconductor (MOS) transistor.

10. The ROM of claim 8, wherein each of the rewritable first transistor and the rewritable second transistor is an N-channel MOS transistor.

11. The ROM of claim 8, wherein the rewritable first transistor is separated from the rewritable second transistor by a semiconductor trench formed in the p-type doped semiconductor substrate.

12. The ROM of claim 11, wherein the n-doped semiconductor layer includes a portion extending into the p-type doped semiconductor substrate.

13. The ROM of claim 12, wherein the semiconductor trench extends through the p-type doped semiconductor substrate to the portion of the n-doped semiconductor layer extending into the p-type doped semiconductor substrate.

14. The ROM of claim 8, wherein the well adjusts a threshold voltage of the rewritable second transistor.

15. A method of manufacturing a read-only memory (ROM) comprising a plurality of memory cells, each of the plurality of memory cells comprising a rewritable first transistor and a rewritable second transistor, an insulated gate of the rewritable first transistor connected to an insulated gate of the rewritable second transistor, the method comprising:
    successively depositing, on a semiconductor structure, a first insulating layer and a first gate layer, wherein the first insulating layer is arranged between the semiconductor structure and the first gate layer, wherein the rewritable second transistor further includes a well formed between an associated first insulating layer and the semiconductor structure, and wherein the first insulating layer is in direct contact with the semiconductor structure; and
    successively depositing a second insulating layer and a second gate layer.

16. The method of claim 15, wherein each of the rewritable first transistor and the rewritable second transistor is a metal-oxide-semiconductor (MOS) transistor.

17. The method of claim 15, wherein each of the rewritable first transistor and the rewritable second transistor is an N-channel MOS transistor.

18. The method of claim 15, wherein the semiconductor structure comprises a p-type doped semiconductor substrate stacked on an n-doped semiconductor layer, wherein the n-doped semiconductor layer is stacked on a p-doped semiconductor layer, and wherein the rewritable first transistor is separated from the rewritable second transistor by a semiconductor trench formed in the p-type doped semiconductor substrate.

19. The method of claim 18, wherein the n-doped semiconductor layer includes a portion extending into the p-type doped semiconductor substrate, and wherein the semiconductor trench extends through the p-type doped semiconductor substrate to the portion of the n-doped semiconductor layer extending into the p-type doped semiconductor substrate.

20. The method of claim 15, wherein the well adjusts a threshold voltage of the rewritable second transistor.

* * * * *